(12) United States Patent
Ouali et al.

(10) Patent No.: US 7,886,258 B2
(45) Date of Patent: Feb. 8, 2011

(54) METHOD AND APPARATUS FOR REMOVING DUMMY FEATURES FROM A DATA STRUCTURE

(75) Inventors: Mohammed Ouali, Ottawa (CA); Jason Abt, Kanata (CA); Edward Keyes, Ottawa (CA); Vyacheslav Zavadsky, Ottawa (CA)

(73) Assignee: Semiconductor Insights, Inc., Ottawa, Ontario (CA)

( * ) Notice: Subject to any disclaimer, the term of this patent is extended or adjusted under 35 U.S.C. 154(b) by 0 days.

(21) Appl. No.: 12/816,144

(22) Filed: Jun. 15, 2010

(65) Prior Publication Data

US 2010/0257501 A1    Oct. 7, 2010

Related U.S. Application Data

(62) Division of application No. 11/976,409, filed on Oct. 24, 2007, now Pat. No. 7,765,517, which is a division of application No. 11/174,732, filed on Jul. 6, 2005.

(51) Int. Cl.
  *G06F 17/50* (2006.01)
(52) U.S. Cl. .................. 716/118; 716/101; 716/119; 716/120; 430/5; 703/2; 382/144; 382/145
(58) Field of Classification Search .............. 716/101, 716/118–120; 430/5; 703/2; 382/144–145
See application file for complete search history.

(56) References Cited

U.S. PATENT DOCUMENTS

| 4,805,123 | A | * | 2/1989 | Specht et al. ............... 382/144 |
| 5,060,282 | A | | 10/1991 | Molley |
| 5,060,284 | A | * | 10/1991 | Klees ......................... 382/252 |
| 5,287,856 | A | | 2/1994 | Treiber |
| 5,361,311 | A | | 11/1994 | Wilson |
| 5,481,625 | A | | 1/1996 | Suzuki |
| 5,548,326 | A | | 8/1996 | Michael |
| 5,608,816 | A | | 3/1997 | Kawahara et al. |
| 5,613,013 | A | * | 3/1997 | Schuette ..................... 382/124 |
| 5,640,200 | A | * | 6/1997 | Michael ........................ 348/87 |
| 5,781,656 | A | | 7/1998 | Hagino et al. |
| 5,861,910 | A | | 1/1999 | McGarry et al. |
| 5,917,953 | A | | 6/1999 | Ausbeck, Jr. |
| 5,933,522 | A | | 8/1999 | Sugimoto |
| 6,005,985 | A | * | 12/1999 | Brison et al. ................ 382/278 |

(Continued)

*Primary Examiner*—Naum B Levin
(74) *Attorney, Agent, or Firm*—Sterne, Kessler, Goldstein & Fox P.L.L.C.

(57) ABSTRACT

A method and apparatus to reduce occurrences of electrically non-functional elements, known as dummy features, from a source data structure is described. The source data structure may be image data, a vector based data structure or some other data format. Dummy features in the source data structure are detected and then deleted. Dummy features may be detected by selecting a representative dummy feature, using it as a reference pattern or polygon and comparing it to features in the source data structure. The step of comparing the selected reference to the comprises selecting a cut-off correlation threshold value, and computing the correlation coefficients between the reference and the feature. Features are selectively removed based on a comparison between their correlation coefficients and the selected cut-off correlation threshold value. This threshold value may require updating to remove all dummy features in the source data structure. When different shaped dummy features in the same data structure are encountered, a further reference feature may be selected and the process repeated.

6 Claims, 5 Drawing Sheets

U.S. PATENT DOCUMENTS

| | | | |
|---|---|---|---|
| 6,047,084 A | 4/2000 | Kent et al. | |
| 6,075,905 A | 6/2000 | Herman et al. | |
| 6,088,483 A | 7/2000 | Nakano et al. | |
| 6,236,746 B1 | 5/2001 | Chamberlain et al. | |
| 6,290,572 B1 | 9/2001 | Hoffmann | |
| 6,295,374 B1 * | 9/2001 | Robinson et al. | 382/218 |
| 6,305,000 B1 | 10/2001 | Phan et al. | |
| 6,333,141 B1 | 12/2001 | Carter et al. | |
| 6,473,536 B1 | 10/2002 | Chiba et al. | |
| 6,567,949 B2 | 5/2003 | Heinen et al. | |
| 6,581,193 B1 * | 6/2003 | McGhee et al. | 716/4 |
| 6,587,579 B1 | 7/2003 | Bass | |
| 6,594,801 B1 | 7/2003 | Dishon et al. | |
| 6,609,235 B2 | 8/2003 | Ramaswamy et al. | |
| 6,658,145 B1 | 12/2003 | Silver et al. | |
| 6,674,890 B2 * | 1/2004 | Maeda et al. | 382/149 |
| 6,691,052 B1 | 2/2004 | Maurer | |
| 6,731,991 B1 | 5/2004 | Michalski et al. | |
| 6,751,343 B1 | 6/2004 | Ferrell et al. | |
| 6,846,597 B2 | 1/2005 | Narukawa et al. | |
| 6,865,727 B2 | 3/2005 | Frerichs et al. | |
| 6,870,951 B2 | 3/2005 | Cai | |
| 6,901,574 B2 | 5/2005 | LaCour et al. | |
| 6,930,782 B1 | 8/2005 | Yi et al. | |
| 6,969,762 B2 | 11/2005 | Ehrlich et al. | |
| 6,975,755 B1 | 12/2005 | Baumberg | |
| 7,003,758 B2 | 2/2006 | Ye et al. | |
| 7,014,955 B2 | 3/2006 | Chang et al. | |
| 7,016,539 B1 | 3/2006 | Silver et al. | |
| 7,020,866 B2 | 3/2006 | Kamon | |
| 7,030,961 B2 * | 4/2006 | Den Boef et al. | 355/53 |
| 7,075,704 B2 | 7/2006 | Kurashina | |
| 7,124,386 B2 | 10/2006 | Smith et al. | |
| 7,136,518 B2 * | 11/2006 | Griffin et al. | 382/133 |
| 7,206,443 B1 | 4/2007 | Duvdevani et al. | |
| 7,236,634 B2 | 6/2007 | Miyakoshi et al. | |
| 7,239,738 B2 | 7/2007 | Yasukawa et al. | |
| 7,242,095 B2 | 7/2007 | Tabara et al. | |
| 7,278,121 B2 | 10/2007 | Aitnouri et al. | |
| 7,363,099 B2 | 4/2008 | Smith et al. | |
| 7,383,521 B2 * | 6/2008 | Smith et al. | 716/6 |
| 7,409,260 B2 | 8/2008 | David et al. | |
| 7,412,676 B2 | 8/2008 | Cobb et al. | |
| 7,415,150 B2 * | 8/2008 | Maali | 382/151 |
| 7,433,508 B2 | 10/2008 | Sakai et al. | |
| 7,448,010 B1 * | 11/2008 | Lenahan et al. | 716/10 |
| 7,705,267 B2 * | 4/2010 | Heyl | 219/121.68 |
| 7,765,517 B2 * | 7/2010 | Ouali et al. | 716/19 |
| 2002/0144224 A1 | 10/2002 | Frerichs et al. | |
| 2003/0044059 A1 | 3/2003 | Chang et al. | |
| 2003/0073010 A1 | 4/2003 | Narukawa et al. | |
| 2003/0076361 A1 * | 4/2003 | Hatanaka et al. | 345/771 |
| 2003/0226757 A1 | 12/2003 | Smith et al. | |
| 2004/0098674 A1 | 5/2004 | Vuong et al. | |
| 2004/0121613 A1 * | 6/2004 | Morita | 438/717 |
| 2004/0151392 A1 | 8/2004 | Miyakoshi et al. | |
| 2004/0170326 A1 | 9/2004 | Kataoka et al. | |
| 2005/0096887 A1 * | 5/2005 | Rice et al. | 703/2 |
| 2005/0129305 A1 | 6/2005 | Chen et al. | |
| 2005/0132306 A1 | 6/2005 | Smith et al. | |
| 2005/0251771 A1 | 11/2005 | Robles | |
| 2005/0271264 A1 | 12/2005 | Ito et al. | |
| 2005/0286755 A1 | 12/2005 | Maali | |
| 2006/0045325 A1 | 3/2006 | Zavadsky et al. | |
| 2006/0050953 A1 | 3/2006 | Farmer et al. | |
| 2006/0059452 A1 | 3/2006 | Whitefield et al. | |
| 2006/0098893 A1 | 5/2006 | Kondo et al. | |
| 2006/0104103 A1 | 5/2006 | Colineau et al. | |
| 2006/0161403 A1 * | 7/2006 | Jiang et al. | 703/2 |
| 2006/0245631 A1 | 11/2006 | Levenson et al. | |
| 2007/0011628 A1 | 1/2007 | Ouali et al. | |
| 2007/0062284 A1 | 3/2007 | Machida | |
| 2007/0256039 A1 | 11/2007 | White | |
| 2008/0059920 A1 | 3/2008 | Ouali et al. | |

\* cited by examiner

METHOD AND APPARATUS FOR REMOVING DUMMY FEATURES FROM A DATA STRUCTURE

CROSS REFERENCE TO RELATED APPLICATIONS

This application is a divisional of U.S. application Ser. No. 11/976,409, filed Oct. 24, 2007, which is a divisional of U.S. application Ser. No. 11/174,732, filed Jul. 6, 2005, both of which are incorporated by reference herein in their entirety.

BACKGROUND OF THE INVENTION

1. Field of the Invention

The present invention relates to VLSI device layout data structures, and more particularly to reducing the size and complexity of the data structure.

2. Background Art

Current manufacturing techniques for fabricating VLSI devices require the insertion of non-functional structures, commonly known as dummy features, in order to ensure the planarity of subsequent dielectric and conductive layers in locations where there is no circuitry. VLSI layers commonly populated with these dummy features include the metal, polysilicon and field isolation layers. These dummy features are normally electrically non-functional, although they may be interconnected between different layers, and in some cases dummy features have been used to alter the capacitance of some functional elements. All dummy features used within a layer are normally, but not always, identical.

Depending on the application, data structures of the multiple layers of the VLSI device may be generated from the physical device to verify the circuit design or for the reverse-engineering extraction of the circuitry. These data structures are normally constructed in a vector-based format, known commonly in the industry as GDSII. The dummy features, if not removed from the generated data structure, add more complexity to signal tracing and/or analysis of the circuits; and reduce the clarity with which multiple layers may be seen when overlaid. Additionally they significantly increase the size of the already large vector-based data structures, without significantly adding function. When processing these data structures to recognize function, dummy features add needless processing time.

There exists in the art a method to compress the dummy features in a vector-based data structure to reduce the size of the data. U.S. Pat. No. 6,594,801, which issued to Dishon et al. on Jul. 15, 2003, provides a loss-less method for compressing a data structure representing a layout of a multi-layered VLSI device. This method comprises the steps of (a) generating compressed non-functional element data structures that represent each of the non-functional elements of each layer within the layout data structure, (b) deleting representations of non-functional elements from the layout data structure and (c) adding the compressed non-functional element data structures to generate a compressed data structure representing the layout. While this technique does reduce the amount of data in the data structure, it is a complex compression process requiring intensive computing power. Further, as the technique is directed towards the re-use of the non-functional elements, the method simply compresses the data within the vector-based data structure but does not remove the non-functional elements. The non-functional elements are still present in the data structure and needlessly increase its size and processing time. Furthermore, when the data structure for the entire IC from this method is visualized, the lower metal layers of connectivity are obscured by the dummy features on the upper levels. This complicates signal tracing and analysis for an observer. Still furthermore, the method does not teach how to locate the non-functional elements within the data structure, and as such would not be useful in data structures other than GDSII format data structures.

Therefore there is a need for a method and apparatus to remove dummy features from data structures.

SUMMARY OF THE INVENTION

The present invention is directed to a method and apparatus to reduce occurrences of electrically non-functional elements, known as dummy features, from a source data structure. The source data structure may be image data provided by a high-resolution image acquisition system to image electronic circuits and embedded features of an integrated circuit (IC). Alternatively, the source data structure may be vector based data provided in the industry standard GDSII format. In accordance with the present invention, dummy features in the source data structure are detected and then deleted from the source data structure.

In accordance with an aspect of this invention, dummy features in a source data structure are detected by selecting a representative dummy feature pattern or polygon as a reference pattern or polygon, depending on the on the type of source data structure, and comparing the selected reference pattern or polygon to feature patterns or polygons in the source data structure.

In accordance with a further aspect of the invention, a dummy feature pattern may be selected by framing the dummy feature reference pattern by a pixel matrix of m×n pixels and selecting a cut-off correlation threshold value. A dummy feature polygon may be selected by forming the dummy feature reference polygon by extracting points of interest from the dummy feature and then selecting a cut-off correlation threshold value.

In accordance with another aspect of the invention, the step of comparing the selected reference pattern to feature patterns in the source data structure comprises computing the correlation coefficients between the reference pattern and the feature patterns in the source data structure and comparing computed correlation coefficients to the selected cut-off correlation threshold value. However, the comparing of selected reference polygons to feature polygons in the source data structure includes computing the correlation coefficients between points of interest in the feature polygons in the source data structure and the reference polygon.

In accordance with a specific aspect of the invention, the computed correlation coefficients may be based on gray scale values or may be calculated using a sum of squared differences equation:

$$SSD(i, j) = \sum_{k=1}^{n} \sum_{c=1}^{m} [I(i+k, j+c) - P(k, c)]^2$$

where:
I (i, j) is the image array;
P is the reference pattern array;
SSD (i, j) is the correlation coefficient,
(i, j) are the coordinates in the image array.

In accordance with a further aspect of the invention, feature patterns or polygons are selectively removed based on a comparison between their correlation coefficients and the selected cut-off correlation threshold value. A new threshold value may be selected to remove all dummy features in the source data structure or to prevent removal of non-dummy features. In the case of differently shaped dummy features in the same data structure, another reference pattern or polygon will be selected and the process repeated. Once the identified dummy features have been deleted from the source data structure, another data structure may be loaded and the above process repeated.

In accordance with another aspect of the invention, the source data structure with the removed dummy features may be stored in a memory together with the selected dummy feature pattern or polygon and the last selected cut-off correlation threshold.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

For purposes of explanation, specific embodiments are set forth to provide a thorough understanding of the present invention. However, it will be understood by one skilled in the art, from reading this disclosure, that the invention may be practiced without these specific details. Moreover, well-known elements, devices, process steps and the like are not set forth in detail in order to avoid obscuring the scope of the invention described.

The present invention provides a method and apparatus for creating a processed data structure representation of an IC layout with reduced occurrences of electrically non-functional elements, known as dummy features, from a source data structure. The source data structure may be in the form of image data provided by a high-resolution image acquisition system to image electronic circuits and embedded features of an integrated circuit (IC). Alternatively, this source data structure may be provided as a vector-based representation of the layout in the industry standard GDSII format. The source data structure could also be in other formats known to one skilled in the art. The non-functional elements are normally in the form of dummy features which can be used to maintain the planarity of the device between the various interconnect layers.

Figure 1:
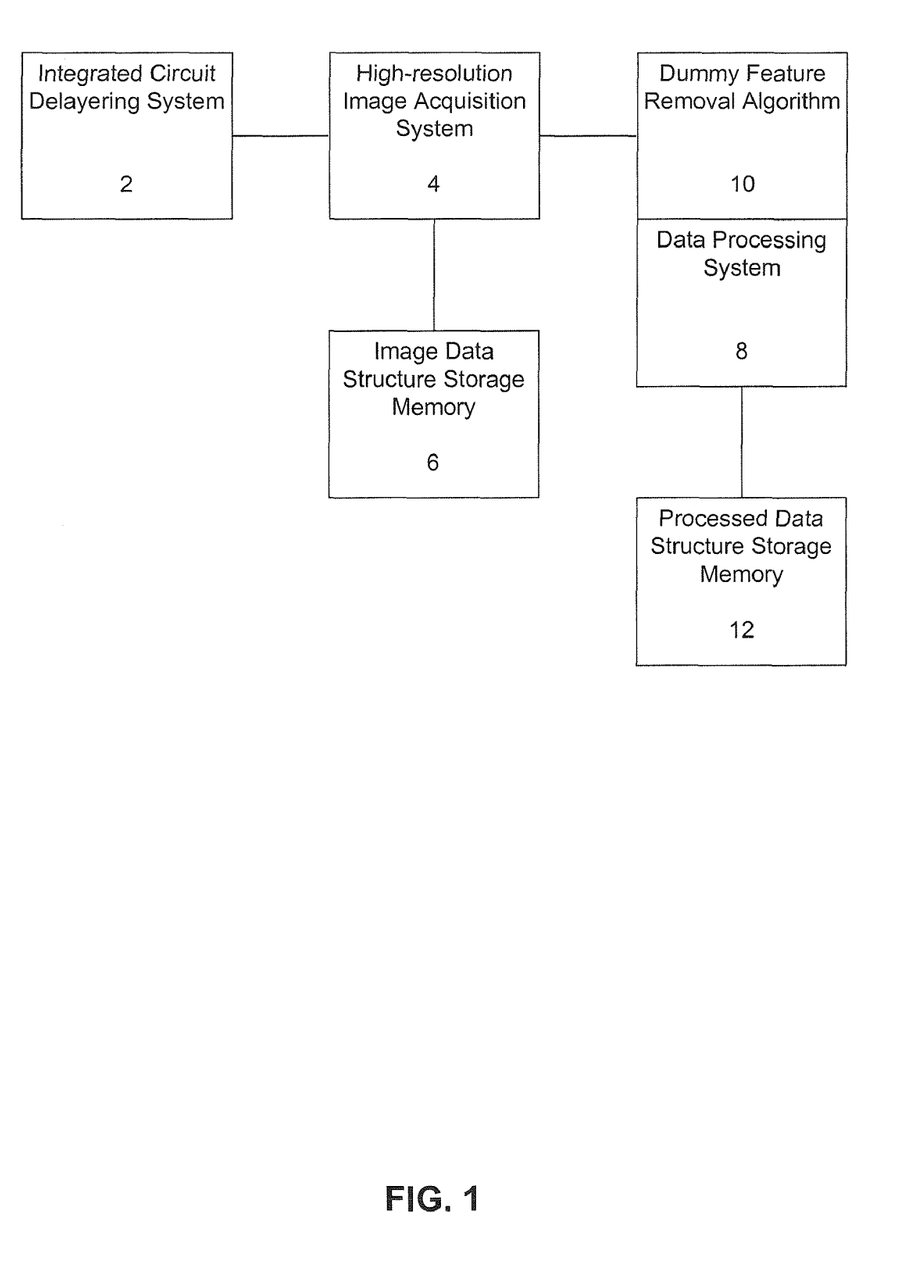
FIG. 1 is a block diagram depicting an embodiment of apparatus in accordance with the present invention.

The apparatus in FIG. 1 schematically illustrates a system for delayering an integrated circuit or VLSI device of interest, which is then imaged using a high-resolution image acquisition system 4, usually a scanning electron microscope, optical microscope or the like. In accordance with the present invention, the image data is loaded into a storage memory 6 for processing. The data processing system 8 has the dummy feature removal algorithm 10 programmed therein. The data processing system 8 compares the patterns of features in the source data structure in the storage memory 6 to a reference dummy feature pattern using the dummy feature removal algorithm 10 and removes detected dummy feature patterns from the source data structure. Once the source data structure has been processed as per the parameters of the dummy feature removal algorithm 10, the processed data structure is stored in the processed data structure storage memory 12. Further source data structures may be processed in the same manner.

When the source data structure is an image-based data structure, the dummy features to be removed are detected by comparing the patterns of features in the source data structure to a user defined dummy feature reference pattern and using a selected cut-off threshold. A correlation coefficient is calculated using the gray-scale values of the pixels in each of the reference pattern and the feature pattern. In the general sense, any patterns in the source data structure, that have a correlation coefficient value better than the threshold value are deemed to be dummy features and are deleted. Those patterns, having a value worse than the threshold value, are deemed not to be dummy features and remain in the data structure. The relationship between the correlation coefficient and the threshold value is dependent on the particular equation used to calculate the correspondence. The selected threshold value may require updating by changing the tolerances in order to remove all dummy features within the data structure. A more detailed description of these steps is provided below with reference to the figures.

Figure 2:
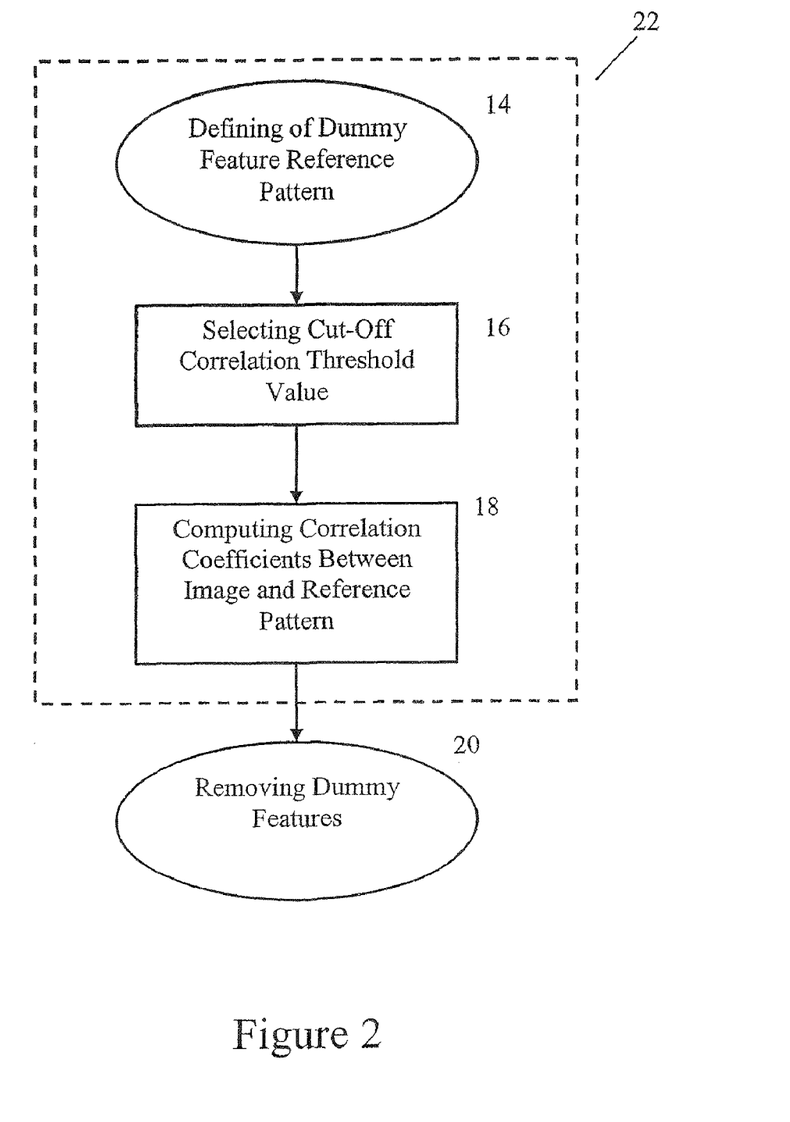
FIG. 2 is a basic flowchart representation of the present invention.

The basic steps of the present invention are summarized in the flowchart of FIG. 2. There are two stages in the process including a calibration stage for detecting 22 dummy features and a removal stage for removing 20 the dummy features. The calibration stage includes defining 14 the dummy feature pattern to be used as a reference and selecting 16 a correlation cut-off threshold. Correlation coefficients between the feature patterns in the source data structure and the reference pattern are computed 18 using a correlation equation. The correlation coefficients are then compared to the selected cut-off threshold coefficient. Feature patterns that have a correlation coefficient better than the threshold value are identified as the dummy features, which are removed 20.

Figure 3:
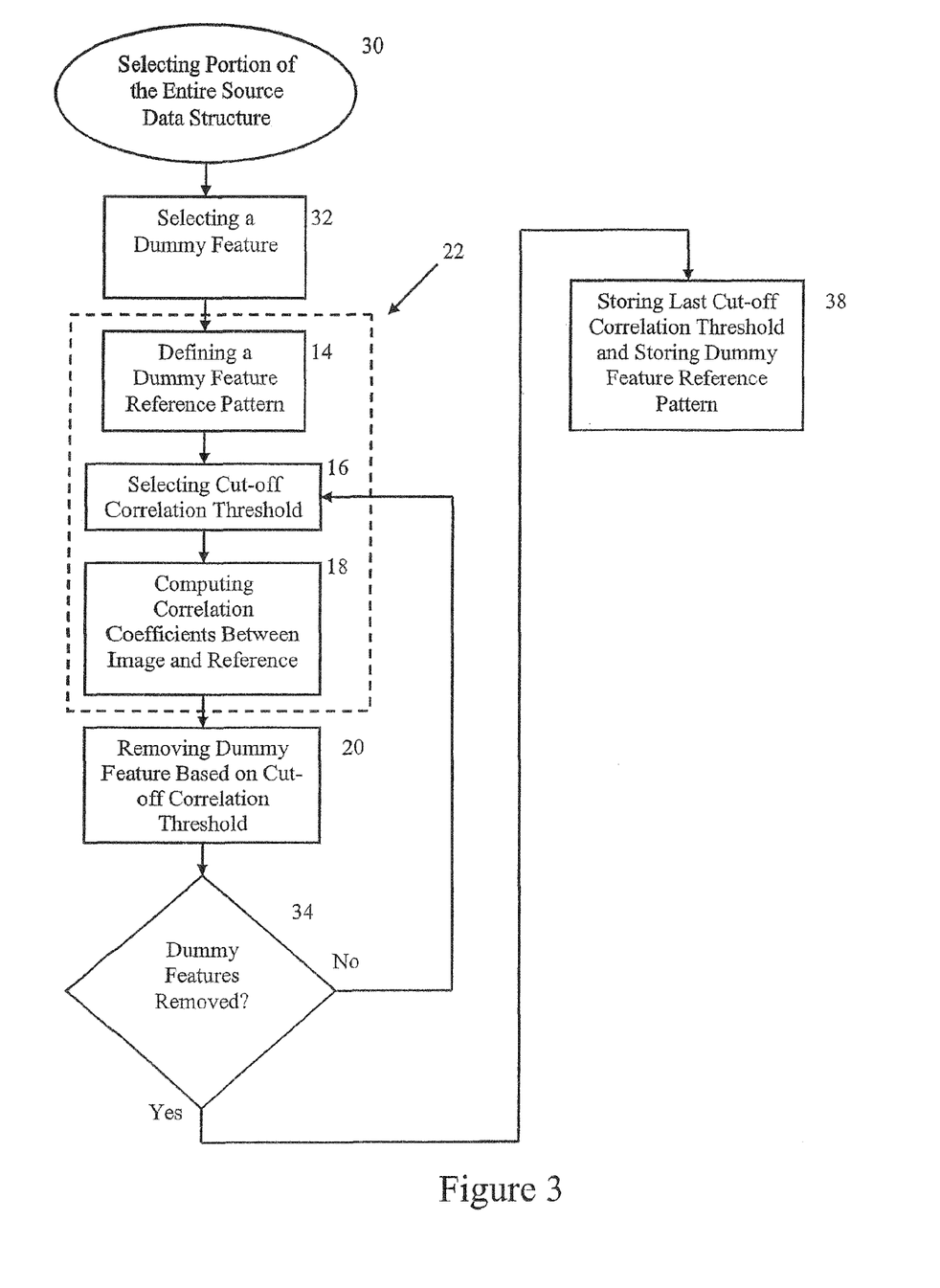
FIG. 3 is a flowchart representation of an embodiment of a calibration stage of an embodiment of the present invention.

One embodiment of the calibration stage is described in detail below with reference to FIG. 3. In the preferred embodiment a small portion of the entire source data structure is selected 30 for the calibration stage (an i×j matrix of pixels). This portion would be selected by the user based on the number of dummy features in the observed structure. The greater the number of dummy features the more useful the dummy feature calibration will be when moved to the deletion stage. After the selection of the calibration portion, a human operator examines the selected portion of the source data structure and selects 32 a dummy feature to be used as a reference pattern 14. The user accomplishes this by selecting a pixel matrix of m×n pixels to frame the reference dummy feature pattern. The operator then selects 16 a starting correlation cut-off threshold value, alternatively the starting point may be auto-selected as a predetermined value. The system then examines a portion (a size corresponding to the m×n matrix of the reference pattern) of the calibration data structure, starting at an origin point. This is called a feature pattern. If the calibration data structure is an image file, then the gray-scale values from the dummy reference pattern are obtained and used to compute 18 the correlation coefficient. The system compares the gray-scale values of the dummy reference pattern to the gray-scale values of the feature pattern within the calibration data structure. A correlation coefficient may be computed 18, for example, as a sum of squared difference (SSD) correlation coefficient. Those skilled in the art will understand that other correlation methods may be used without departing from the scope of the invention.

After the correlation coefficient is calculated between the dummy reference pattern and the feature pattern, a comparison is made between the calculated correlation coefficient and the selected cut-off threshold value. Once a feature pattern is identified as corresponding to the reference pattern by showing correlation better than the selected threshold value, it is deleted 20 from the layout data structure.

The following formula details the process by which the correlation coefficient may be calculated 18 using a sum of squared difference calculation:

$$SSD(i, j) = \sum_{k=1}^{n} \sum_{c=1}^{m} [I(i+k, j+c) - P(k, c)]^2$$

where:
I (i, j) is the image array;
P is the reference pattern array;
SSD (i, j) is the correlation coefficient for all (i, j);
(i, j) are the pixel coordinates in the image array. After the comparison is made, the system iterates the coordinates of the feature pattern to compare the next portion of the calibration data structure. This continues until the system has calculated the correlation coefficients for the entire calibration data structure.

When a dummy feature is detected, it is removed 20. Removal means the deletion of the feature from the source data structure, what remains is the background information of the source data structure. In the case of image data this means the replacement of the pixel space occupied by the feature, with pixel data corresponding to background. Information indicating the former presence of a dummy feature will not be available.

A human operator examines the calibration area file to determine if all the dummy features have been removed 34 using the selected 16 cut-off correlation threshold. The operator may update the cut-off correlation threshold by selecting 16 a new value for the cut-off threshold value if an insufficient number of dummy features were removed. If there are dummy features remaining, the operator may choose to lower 16 the correlation cut-off threshold value. Also, if the operator finds that features that are not dummy-features have been removed, the operator may choose to raise 16 the correlation cut-off threshold value. For example, an exact match between the reference pattern 14 and a pattern of interest would require the values for both the defined 14 reference pattern and the pattern of interest to be identical. Due to the non-uniform illumination and noise in an image-based data-structure, the gray-scale levels on identical dummy feature patterns will vary slightly. A more realistic cut-off correlation threshold value may be selected 16, permitting a slight variance between patterns.

It should be noted by those skilled in the art that other methods besides calculating the gray-scale values of dummy feature patterns may be used to calculate correlation without departing from the scope of the invention. As discussed earlier, if the data structure took alternate formats, such as a GDSII format, gray-scale data would not be available, but alternate data could be used for comparison. One skilled in the art would be able to examine the vector-based data structure to extract points of interest from the dummy feature to form a reference polygon. These points of interest could be compared to the feature polygons in the data-structure, which would enable a similar correlation comparison made for the gray-scale data. A correlation threshold could be set for correlation between points of interest in the reference polygon as compared to the feature polygon, identifying the dummy features for removal. Also, one skilled in the art would be able to create a labeled pixel data structure from the GDSII information, wherein the pixel values would correspond to whether or not the pixel was part of the background, a metal line, or a via. For the sake of simplicity, we will not discuss these alternates in detail here, but it should be understood that gray-scale data could be substituted by other types of data upon which a correlation could be made without departing from the scope of the invention. Alternate correlation methods could also be used depending on the format of the source data structure, the other methods for example could include, FFT (Fast Fourier Transform), geometric hashing or feature-based algorithms. It should also be noted that the steps of determining the presence of dummy features and adjusting the cut-off threshold may also be performed algorithmically without departing from the scope of the invention.

The remaining dummy features are detected using the newly updated threshold value. This updating step 34 may be repeated several times until a sufficient number of dummy features have been detected and deleted. Once this is done, the "best fit" cut-off selected 16 threshold value, that is, the last threshold value computed and the defined 14 reference dummy feature pattern are stored 38 in memory.

Figure 4:
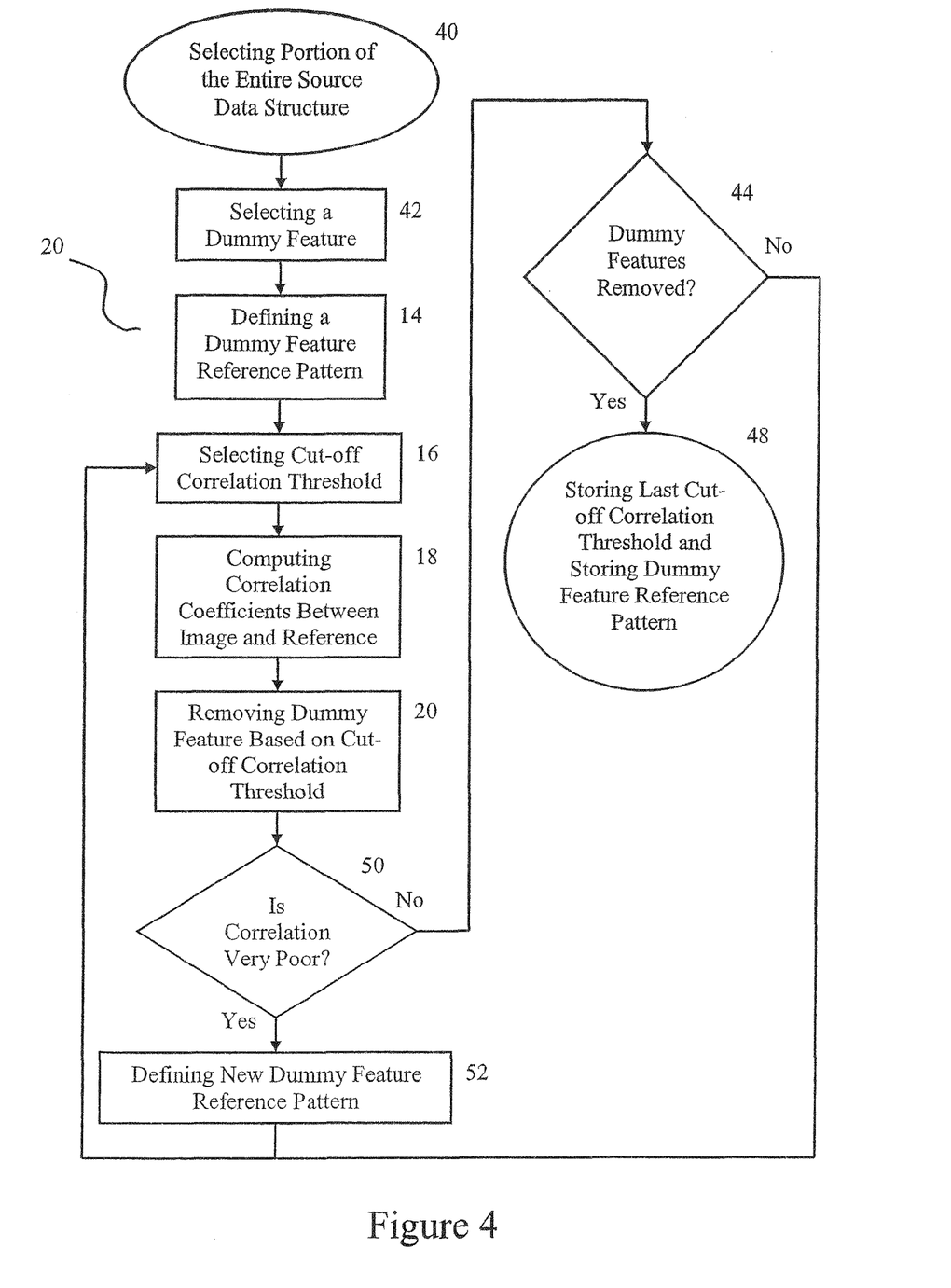
FIG. 4 is a flowchart representation of another embodiment of a calibration stage of an embodiment of the present invention.

In another embodiment of the present invention, a user may find that the selected dummy feature reference pattern is not the best example of the dummy feature pattern in the source data structure. If an operator discovers a poor correlation between the reference pattern and the feature patterns; one may chose a new dummy feature pattern as a better representation. FIG. 4 is a flow chart representation of another embodiment of the calibration stage. The user defines 40 a calibration portion of the source data structure to examine. The user then selects 42 a dummy feature and defines 14 the dummy feature reference pattern by selecting an m×n matrix of pixels that frames the dummy feature pattern. The user then selects 16 an initial cut-off correlation threshold value. The system then calculates 18 the correlation between the reference pattern and the feature patterns. Feature patterns that demonstrate correlation to the reference pattern either at or below the correlation threshold value, are selected as dummy features, and are deleted 20. The user then observes the calibration portion of the source data structure to determine whether a significant number of dummy feature have been removed 50. If the user finds that the majority of dummy features were not removed, the user determines that the selected reference pattern 14 is a poor representation of the dummy feature pattern, and the user then selects 52 a new dummy feature as the selected reference pattern. Steps 16, 18, 20, and 50 are repeated until the user finds that the majority of dummy feature patterns are being removed, and thus a good reference pattern has been selected 14. Subsequently, the user then examines to see if a sufficient number of dummy features have been removed 44. If not, the user updates the correlation threshold value to reflect the change needed, and steps 16, 18, 20, 50 and 44 are repeated again. Finally, when the user finds that a sufficient number of dummy features have been removed, the calibration is considered to have been completed, and the last cut-off correlation threshold value and the dummy feature reference pattern is stored 48 in memory.

Figure 5:
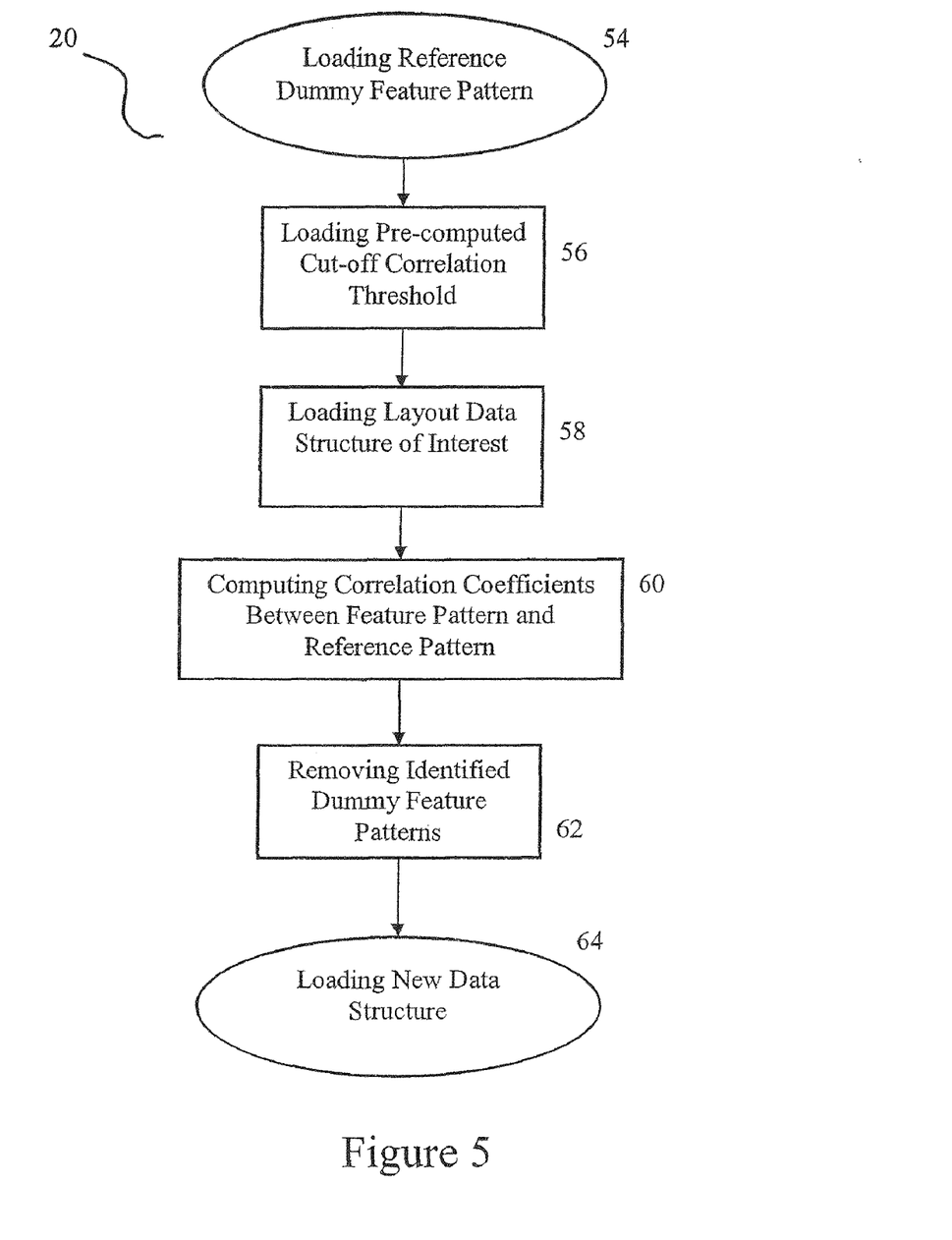
FIG. 5 is a flowchart representation of the dummy feature removal stage of an embodiment of the present invention.

FIG. 5 is a flow chart representation of an embodiment of the deletion stage in accordance with the present invention. The source data structure is loaded 58 into the system, along 54 with the reference dummy feature pattern and 56 the cut-off correlation threshold value as determined by the calibration stage 22. A sum of squared difference (SSD) correlation coefficient, for example, is computed 60 for the loaded source data structure 58 and the loaded 54 reference pattern in order to detect dummy feature patterns. The detected dummy features are removed 62 based on a comparison to the loaded 56 cut-off correlation threshold value. Once the identified dummy features have been deleted from the source data structure, another source data structure may be loaded 64 and the above process is repeated.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the scope of the invention as defined in the claims. Therefore, the invention as defined in the claims, must be accorded the broadest possible interpretation so as to encompass all such modifications and equivalent structures and functions.

What is claimed is:

1. A method of producing a processed data structure representation from a vector a based source data structure of an IC layout with reduced occurrences of dummy features comprising the steps of:
   (a) examining a portion of the source data structure and selecting a dummy feature to be used as a reference polygon in a computerized processing system;
   (b) selecting a cut-off correlation threshold value to be used in the computerized processing system;
   (c) computing, in the computerized processing system, correlation coefficients between points of interest in feature polygons in the source data structure and the reference polygon to detect dummy features; and
   (d) removing all of the detected dummy features from the source data structure.

2. The method according to claim 1, further comprising the steps of:
   (e) examining the source data structure with the removed dummy features to determine if further dummy features remain;
   (f) updating the cut-off correlation threshold value; and
   (g) repeating steps e. and f. if necessary.

3. The method according to claim 2, further comprising the step of:
   (h) repeating steps e., f. and g. if necessary.

4. The method according to claim 3, further comprising the steps of:
   (j) storing the source data structure with the removed dummy features in a memory;
   (k) storing the dummy feature reference polygon in a memory; and
   (l) storing the last selected cut-off correlation threshold in a memory.

5. The method according to claim 1, further comprising the steps of:
   (e) examining the source data structure with the removed dummy features to determine if a significant number of dummy features have been removed; and
   (f) selecting another dummy feature reference polygon if a significant number of dummy features have not been removed.

6. The method according to claim 1, wherein steps c. and d. are implemented automatically by a dummy feature removal algorithm programmed in the computerized processing system.

* * * * *